(12) United States Patent
Hoffman

(10) Patent No.: US 6,288,602 B1
(45) Date of Patent: Sep. 11, 2001

(54) CMOS ON-CHIP PRECISION VOLTAGE REFERENCE SCHEME

(75) Inventor: Charles R. Hoffman, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 1641 days.

(21) Appl. No.: 08/580,778

(22) Filed: Dec. 29, 1995

Related U.S. Application Data

(63) Continuation of application No. 08/082,589, filed on Jun. 25, 1993, now abandoned.

(51) Int. Cl.[7] .................................................. G05F 1/10
(52) U.S. Cl. ........................ 327/541; 327/540; 327/156; 327/157
(58) Field of Search ..................... 307/262, 269, 307/296.1, 296.2, 296.4, 296.5, 296.6, 296.7, 296.8, 490, 491, 494; 328/63, 155; 323/313; 365/189.03, 189.07

(56) References Cited

U.S. PATENT DOCUMENTS

| | | | |
|---|---|---|---|
| 3,903,469 | * | 9/1975 | Ravas ........................................ 363/40 |
| 4,507,572 | * | 3/1985 | Hashimoto et al. ................... 327/541 |
| 4,862,015 | * | 8/1989 | Grandfield .......................... 307/296.6 |
| 4,881,244 | * | 11/1989 | Haug ...................................... 327/108 |
| 4,929,882 | * | 5/1990 | Szepesi ................................. 323/222 |
| 4,958,086 | * | 9/1990 | Wang et al. .......................... 327/541 |
| 4,973,857 | * | 11/1990 | Hughes ................................. 327/538 |
| 4,987,387 | * | 1/1991 | Kennedy et al. .................... 331/1 A |
| 5,016,221 | * | 5/1991 | Hamstra .......................... 365/189.07 |
| 5,089,723 | * | 2/1992 | Davis et al. .......................... 327/541 |
| 5,142,696 | * | 8/1992 | Kosiec et al. ........................ 323/315 |
| 5,144,156 | * | 9/1992 | Kawasakai ........................... 328/155 |
| 5,170,297 | * | 12/1992 | Wahler et al. ....................... 328/135 |
| 5,172,018 | * | 12/1992 | Colandrea et al. .............. 307/296.6 |
| 5,173,665 | * | 12/1992 | Norimatsu ........................... 328/155 |
| 5,187,384 | * | 2/1993 | Blöckl ................................... 307/546 |
| 5,206,553 | * | 4/1993 | Imai et al. ............................ 307/540 |
| 5,208,546 | * | 5/1993 | Nagaraj et al. ...................... 328/155 |
| 5,256,980 | * | 10/1993 | Itri ........................................ 328/155 |
| 5,391,979 | * | 2/1995 | Kajimoto et al. ................... 323/313 |

* cited by examiner

*Primary Examiner*—Terry D. Cunningham
(74) *Attorney, Agent, or Firm*—Joscelyn G. Cockburn

(57) ABSTRACT

A process friendly precision voltage generator for use in a digital/analog system or the like, includes a modified phase lock loop (MPLL) and a frequency control system for adjusting the frequency of the MPLL until a desired reference voltage is obtained at an output node of the loop filter. The frequency of the phase lock loop is then locked to the frequency, at which the desired reference voltage has been obtained.

12 Claims, 4 Drawing Sheets

BLOCK DIAGRAM

COUNT SEQUENCE TABLE

| A | 0 | 1 | 0 | 1 | 0 | 1 | 0 | 1 | 0 | 1 | 0 | 1 | 0 | 1 | 0 | 1 |
|---|---|---|---|---|---|---|---|---|---|---|---|---|---|---|---|---|
| B | 0 | 0 | 1 | 1 | 0 | 0 | 1 | 1 | 0 | 0 | 1 | 1 | 0 | 0 | 1 | 1 |
| C | 0 | 0 | 0 | 0 | 1 | 1 | 1 | 1 | 0 | 0 | 0 | 0 | 1 | 1 | 1 | 1 |
| D | 0 | 0 | 0 | 0 | 0 | 0 | 0 | 0 | 1 | 1 | 1 | 1 | 1 | 1 | 1 | 1 |
| COUNT | 0 | 1 | 2 | 3 | 4 | 5 | 6 | 7 | 8 | 9 | 10 | 11 | 12 | 13 | 14 | 15 |

CMOS ON-CHIP PRECISION VOLTAGE REFERENCE SCHEME

This Application is a continuation of Ser. No. 08/082,589 filed Jun. 25, 1993, now abandoned.

BACKGROUND OF THE INVENTION

1. Field of the Invention

This invention relates to integrated circuit technology in general, and more particularly, to circuits that generate reference voltages in said integrated circuit technology.

2. Prior Art

The rapid improvements in the development and use of the CMOS technology has created a need for a process friendly reference voltage generating system. As is used in this application, process friendly means using the regular or standard CMOS process to generate a desired circuit component, module or system. In particular, a process friendly reference voltage generating system is realized from use of a regular or conventional CMOS process.

The generation of a reference voltage using modified CMOS processes has been done in the prior art. Known prior art implementations use two FETs with different threshold voltages. The prior art also teaches that the device threshold voltages can be controlled by ion implementation and/or varying the geometries of the devices. The examples of the prior art teachings are set forth in U.S. Pat. Nos. 4,305,011; 4,442,398; 4,464,588; 4,100,437; 4,327,320; 4,472,871; 4,453,094 and 4,742,292.

Even though the prior art teachings are a step in the right direction in that they suggest using, to the extent possible, a single process for providing the reference voltage generation, they fall short of intended goals in that none uses the standard or conventional CMOS process to provide a reference voltage generation. Stated another way, additional process steps, not common to the standard CMOS process, or devices not commonly used in CMOS technology, are required to generate the prior art reference voltage generators. The additional process steps and devices increase product cost.

BRIEF SUMMARY OF THE INVENTION

It is therefore the main object of the present invention to provide a reference voltage generator which is totally fabricated with a standard CMOS process.

It is a more particular object of the present invention to generate the reference voltage generation with components available in the CMOS technology.

The reference voltage generator can be implemented as part of a VLSI chip or module, system or the like. The reference voltage generator is comprised of a PLL in which the output from the loop filter circuit is the precise reference voltage. The VCO input is coupled to the loop filter circuit and the VCO output is coupled to the frequency adjustment means comprised of a divide by M and a divide by N circuits, M and N being integers, a digital control logic arrangement coupled to the divide circuits and a device, such as a clock, for providing a signal at a predetermined frequency coupled to one of the divide circuits.

The foregoing features and advantages of this invention will be more fully described in the accompanying drawings.

DETAILED DESCRIPTION OF THE PREFERRED EMBODIMENT

Figure 1:
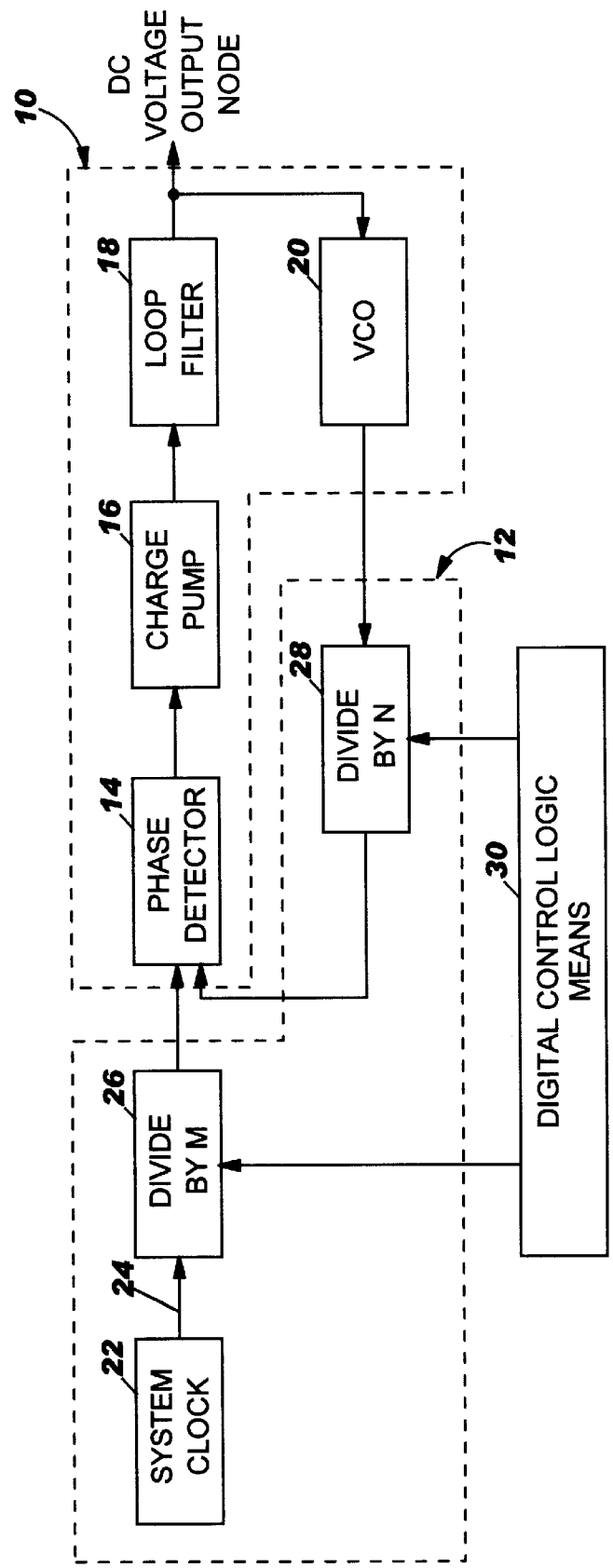
FIG. 1 shows a block diagram of the precision on-chip reference voltage generator according to the teachings of the present invention.

FIG. 1 shows a block diagram of the reference voltage generator according to the teachings of the present invention. The reference voltage includes a modified phase lock loop 10 connected to a frequency adjustment means 12. The frequency adjustment means 12 varies the frequency into the modified phase lock loop 10 until a specific reference voltage is achieved at the DC voltage output node whereby the frequency is fixed in order to maintain the voltage at the desired value. The modified phase lock loop includes phase detector 14, charge pump 16, loop filter 18 and VCO 20. Except for the interconnection between the VCO 20 and phase detector 14, the interconnections between the other components (i.e., phase detector 14, charge pump 16, loop filter 18 and VCO 20) are standard phase lock loop components and interconnections. The designs for each of these components are well known and can be purchased off the shelf. Therefore, detailed descriptions of the components will not be given. Suffice it to say that the phase detector compares the phase of signals at its input and generates a signal on its output. The charge pump performs the function of converting the phase detector output signal (which indicated that the VCO edge is too soon or too late) into precision current pulses which are averaged by the low pass loop filter. The loop filter provides a reference DC voltage signal at its output and the VCO provides a clock signal with a frequency that is proportional to the DC voltage applied to its input. Several prior art and text books have described and discussed each of the components as used in a standard phase lock loop. Included in the prior art are U.S. Pat. Nos.

5,113,152
5,075,638
5,075,575
5,068,626
5,027,429
4,987,387
4,970,472
4,857,866
4,246,547
3,673,430
4,862,015 and
Japan Patent 62-1323.

These prior art references teach improved phase lock loop components and/or different ways of programming synthesizers and can be used as background teachings for examples of components which could be used in the modified phase lock loop of the present invention.

In addition, the goal of the prior art is to control the output frequency of the system under design which is the intended objective of prior art phase lock loops and synthesizers. In contrast, the present invention uses the phase lock loop as the basis for designing a precise reference voltage generator in a VLSI CMOS chip design.

Still referring to FIG. 1, the frequency adjustment means 12 includes a signal generating means 22 which generates a clocking signal on output conductor 24. In the preferred embodiment of the invention, the signal generating means is the system clock in which the reference voltage generator is used. The output conductor 24 is connected to one input of the divide by M circuit 26. The output from the divide by M circuit 26 is fed into one input of phase detector 14. The other input into phase detector 14 is provided by the divide by N circuit 28 which interconnects the VCO 20 and phase detector 14. Both M and N in the divide circuitries are integer numbers. The divide circuitries are respectively connected over separate connectors to digital control logic means 30. In operation, the frequency adjustment means 12 changes the frequency to the modified phase lock loop until a desired voltage is provided at the DC voltage output node whereby the digital control logic means 30 fix (i.e., lock) the frequency of the system and, as a result, the desired voltage is provided at the DC voltage output node.

It should be noted that, for the case where M and N are one (i.e., the output of the device circuits is the same frequency as the input), then the VCO and the system clock will have the same frequency. For M=2 and N=1, the VCO will run at one-half (½) the system clock frequency. For M=1 and N=2, the VCO frequency will be twice the system clock frequency. In general, the range of granularity of adjustment for the VCO (a function of the digital circuitry) can be very precisely controlled which, in turn, results in a precise reference voltage generated at the DC voltage output node.

Figures 2A, 2B:
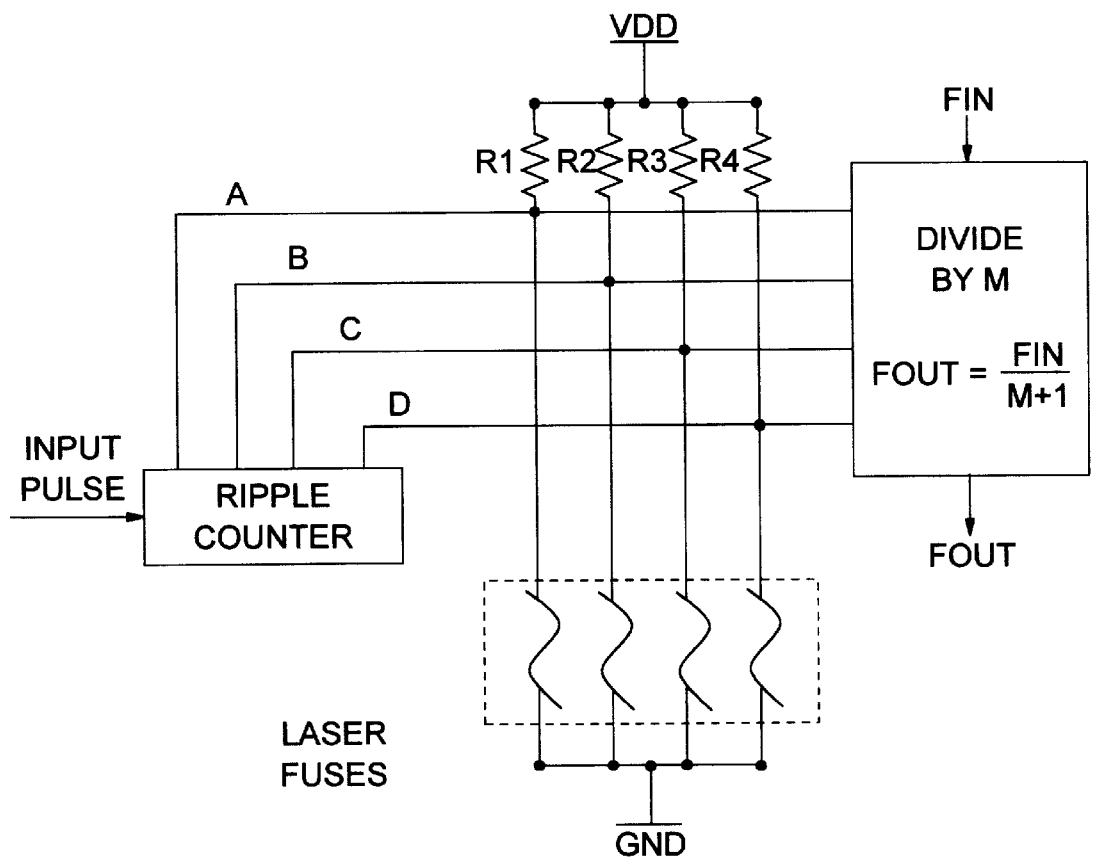
FIG. 2 consisting of FIGS. 2A and 2B, taken together, shows details of the digital control logic.

FIGS. 2A and 2B show a circuit diagram of the digital control logic means.

It should be noted that logic circuits which provide a frequency "divide by K" function where K is a programmable integer number are readily available. A detailed circuit description of these functions can be found in several logic text books including Lenk, J. Logic Designer's Manual, Reston Publishing Co., 1977, pp. 219–222. Another good source are data sheets from manufacturers who make programmable divide integrated circuits (e.g, Motorola MC14569B: Programmable divide-by-N dual 4-bit binary/BCD down counter; or RCA CD4059: CMOS Programmable Divide-by-N Counter).

FIG. 2A shows one way that the divider function could be set after the chip/wafer has been processed. The fuses in the network are polysilicon wires that can be opened by laser cutting. The ripple counter is a string of JK flip flops, for example, Lenk, J. Logic Designers Manual. As input pulses from the clock enter the ripple counter node A will toggle for every pulse, node B will toggle for every second pulse, etc. A count sequence table is given in FIG. 2B. The Divide-by-M function decodes the ABCD data and sets the divisor of the function to give the desired output frequency.

The count that sets the correct output voltage will also be used to "program" the laser cutting operation. For example, suppose the desired output voltage was reached at count 9, then the laser would cut the fuses associated with A and D. When the circuit is operational, the ripple counter outputs will be set to a high output impedance mode (i.e., Hi-Z state) and nodes A and D will be pulled to Vdd; the logic 1 state. Since the fuses associated with nodes B and C are still in the circuit, they will hold these nodes at ground or a logic 0 state. Each one of the fuses is connected via resistors R1, R2, R3 and R4, respectively to the supply voltage VDD.

There are, of course, other ways of programming logic states after a chip has been fabricated. The laser cutting is just one of many ways of achieving a programmable function. An example of using a floating gate technology is given by Fong, E. et al, "An Electrically Reconfigurable Programmable Logic Array Using a CMOS/DMOS Technology," IEEE JSSC, Dec. 1984, pp. 1041–1043. Another example using current blowing fuses is given by Millhollan et al "A 3.6-ns ECL Field Programmable Array Logic Device," IEEE JSSC, Oct. 1985, pp. 1036–1043.

Figure 3:
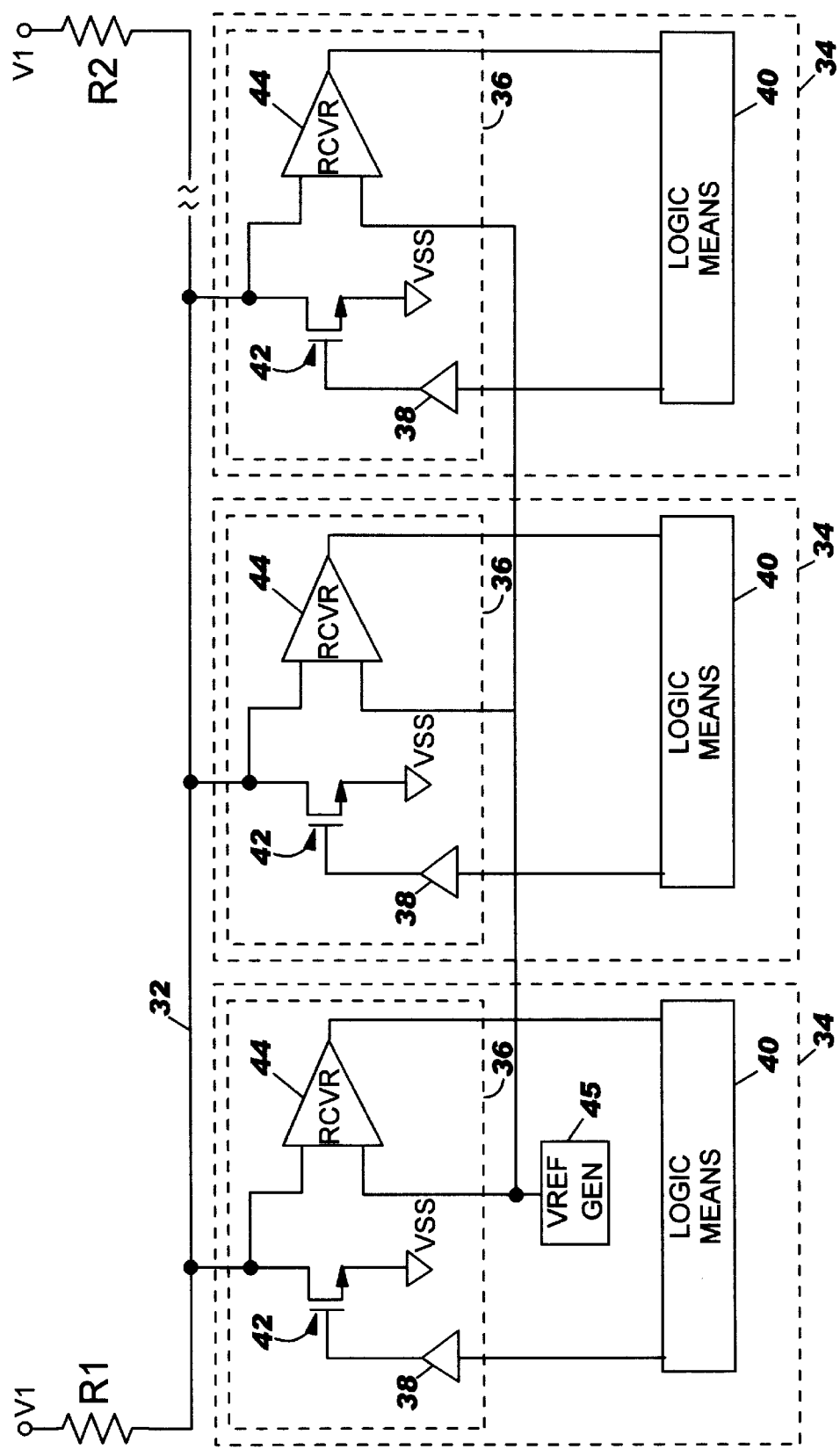
FIGS. 3 and 4 shows a computer system including the teachings of the present invention.
Figure 4:
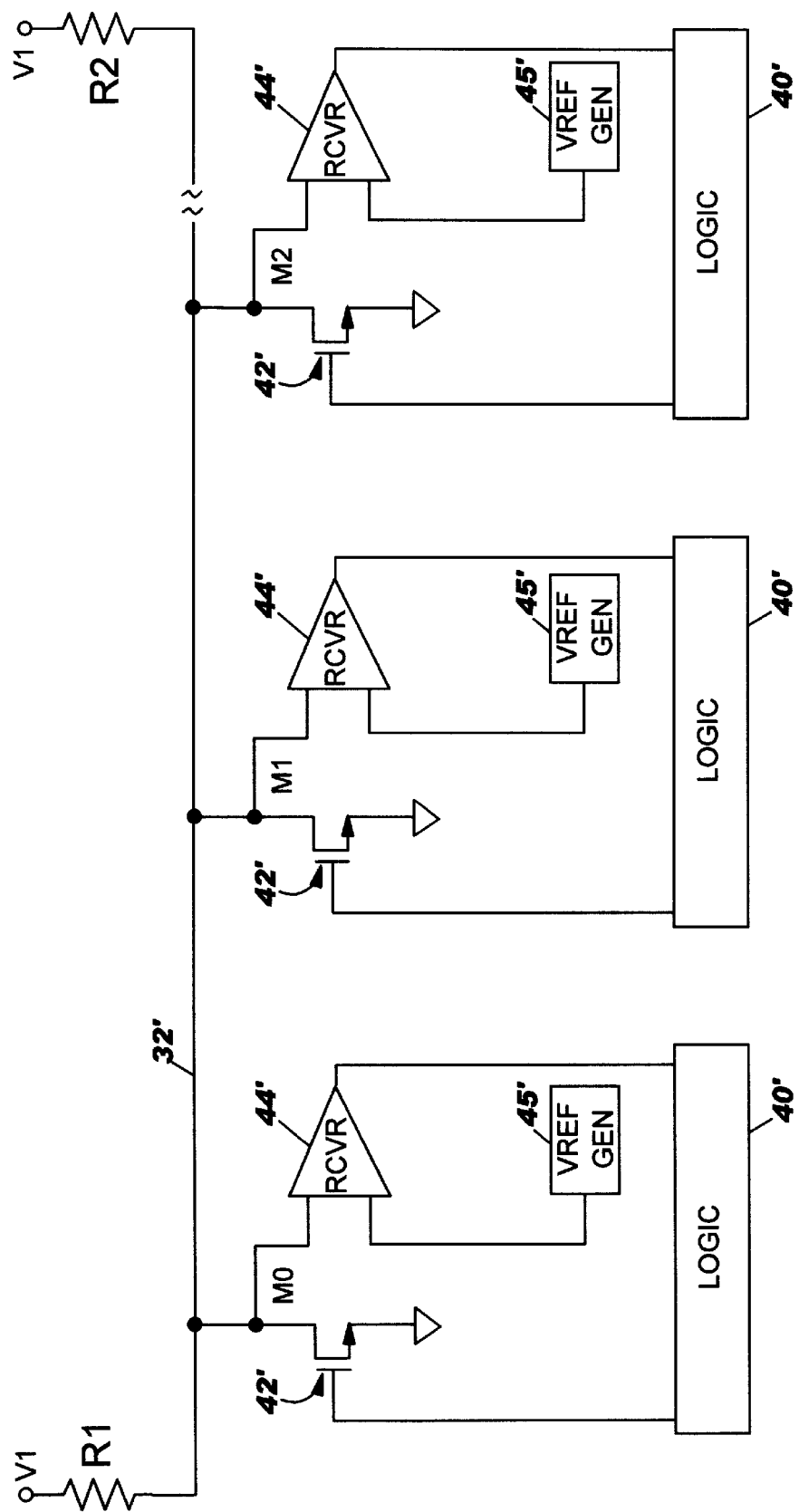

FIGS. 3 and 4 show circuit diagrams of systems embodying the disclosed reference voltage generator. In FIGS. 3 and 4, like elements and systems are denoted by common reference numerals, with prime rotation denoting elements in FIG. 4. The systems include a bus 32, for bidirectional communication, terminated by respective resistors R1 and R2 to supply voltage V1. The break in the bus system indicates that additional subsystems or modules could be attached. A plurality of subsystems or modules 34, only three of which are shown in the figures, are connected to the bus. The subsystems or modules could be microprocessor modules, memory and other functional systems such as token ring or Ethernet adapters, etc. The bus provides communication between the respective subsystems. When the system requires communication, only one is allowed to gain access to the bus. Even though different types of subsystems could be connected to the bus, for purposes of discussion, the sub-systems in FIGS. 3 and 4 are identical. Therefore, only one will be described, it being understood that the description of one covers the description of the others.

Still referring to FIGS. 3 and 4, the module 34 includes a bus attachment unit 36 which attaches the module to the bus. The bus attachment module 36 includes a driver 38 (whose output swing is from Vss to V1) having an input connected to logic means 40 (to be described subsequently) and an output connected to the gate electrode of FET device 42. The emitter electrode of FET device 42 is connected to a reference potential such as ground and the collector electrode of the FET device is connected to the bus. A receiver module 44 has one of its inputs coupled to bus 32 and another output connected to V reference generator 45. The output of receiver 44 is connected to logic means 40. V reference generator 45 is fabricated on the module and provides the reference voltage into receiver 44.

In operation, receiver 44 compares the voltage Vbus on bus 32 to the voltage Vref generated by Vref generator 45 and provides the logic means 40 with a logical 1 (if Vbus is greater than Vref) or a logical 0 (if Vbus is less than Vref). Because of speed, power dissipation, and noise generation, it is desirable to maintain the voltage swing on the bus to be as small as possible. However, margins must be established (above and below the V reference value to accommodate process variations and the allowable tolerance on the V reference circuit. For this last reason, it is desirable to make V reference a precision voltage source. To get this precision source, the industry has either used a more expensive process or employed external modules to supply the precision voltage reference. The present invention provides an on chip voltage generator which overcomes the shortcomings of prior art generators.

It should be noted that even though the functional elements of the module 34, such as logic means 40 and V ref 45 are shown as individual items, in an actual system, they would be built as integrated circuits using one of the well-known manufacturing such as the CMOS process. As stated before, the V reference generator of the present invention is friendly to the CMOS process and, as a result, no extraneous process steps or components have to be used in its implementation.

Still referring to FIGS. 3 and 4, the logic means 40 provide the functions which the chip is developed to provide. For example, if subsystem 34 is a microprocessor, then the logic means would provide the function required by a microprocessor. The driver circuit 38 accepts input signals from logic means 40, feeds the signal through FET 42 onto the bus 32. Likewise, incoming signals into the subsystem 34 are received by receiver 44 and are fed into the logic means 40. As is noted in FIGS. 3 and 4, the reference voltage is provided by the on-chip V reference generator 45 described relative to FIGS. 1 and 2.

In FIG. 3, V reference generator 45, on the first subsystem, provides the V reference for all the receivers in the system. In FIG. 4, the embodiment is an alternate one in which each of the subsystems 34' provide the V reference to its respective receiver. Of course, it is well within the skill of the art to implement other circuit configurations using the teachings of the present invention. Such other circuit configurations are contemplated to fall within the scope of these claims.

Several advantages endure to the user of the present invention. Among the advantages are: 1) increased integration capability (i.e., elimination of an external voltage reference) and 2) the ability of accommodating multiple I/O specification with a single VLSI design. The second advantage is particularly important as the industry moves from the long-established five volts logic era to the reduced range voltage era which will be over a range with the maximum range being less than 5 volts. In a system of multiple chips, this allows some parts of the system design to start before others are defined. A long lead item, such as CMOS VLSI chips, this would be an aid to cycle time reduction. Both advantages lead to lower system costs through reduced chip/module count, multiple use of single design and the reduced process complexity of a standard CMOS process.

Finally, the area required to make such voltage generator is relatively small. A phase lock loop requires an approximate area of 0.126 square millimeters when designed in a 0.8 micron technology.

While this invention has been shown and described with reference to a preferred embodiment thereof, it will be understood by those of skill in the art that variations in form and detail may be made therein without departing from the spirit and scope of the invention.

What I desire to protect by Letters Patent is:
What is claimed is:

1. A computer system comprising:
a bus means for providing bidirectional communications; and
at least two modules coupled to the bus means with each one of said two modules having an interface unit for connecting to the bus means, a logic means for generating at least one desired function coupled to the interface unit and a reference voltage generator for generating and applying a predetermined reference voltage to the interface unit, said reference voltage generator including a phase lock loop, a frequency adjustment means coupled to the phase lock loop, for adjusting frequencies of the phase lock loop until a frequency is set whereat the reference voltage is established and a circuit arrangement for locking the frequency to one of the frequencies which produce the reference voltage.

2. The computer system of claim 1 wherein the interface unit includes a driver circuit with an input terminal coupled to the logic means and an output terminal;
a pull-down FET device having a gate electrode connected to the driver circuit and a collector electrode connected to the bus; and
a receiver having an output coupled to the logic means, a first input coupled to the FET device and a second input coupled to the reference voltage generator.

3. The computer system of claim 1 wherein the phase lock loop includes a phase detector circuitry having an output node and a pair of input nodes;
a charge pump circuitry with an input coupled to the output node and a charge pump output node;
a loop filter circuitry with an output loop filter node for providing the reference voltage and an input loop filter node connected to the charge pump output node; and
a VCO with an input node coupled to the output loop filter to node and a VCO output node.

4. The computer system of claim 3 wherein the frequency adjustment means includes a means for generating a clock signal; said means having a clock output;
a first divide means with a first divide input connected to the clock output and a first divide output connected to one input of the phase detector circuitry;
a second divide means with a second divide input node coupled to the VCO output node; and a second divide output node connected to another input of the phase detector circuitry; and
a digital control logic with separate outputs connected to the first divide means and the second divide means.

5. A reference voltage generator comprising:
a phase lock loop;
a frequency adjustment means coupled to the phase lock loop; said frequency adjustment means operable for adjusting loop frequency until a desired reference voltage is generated at a selected node of said phase lock loop; and
a circuit arrangement, operatively coupled to the frequency adjustment means, for locking the loop frequency at a value whereat the desired reference voltage has been attained.

6. The reference voltage generator of claim 5 wherein the phase lock loop includes a phase detector with a pair of input nodes and an output node;
a charge pump coupled to the output node;
a loop filter circuitry having a reference node for supplying the reference voltage and a loop filter input node coupled to the charge pump;
a VCO having a VCO input node coupled to the reference node and a VCO output node; and
a divide by N circuitry, N being an integer, coupled to the VCO output node and an input of the phase detector.

7. The reference voltage generator of claim 6 wherein the frequency adjustment means includes an oscillator means for generating clock signals;
a divide by M circuitry, M being an integer, for interconnecting the clock signals to another input of said phase detector; and
a digital control logic means for supplying signals to the divide by M circuitry and divide by N circuitry, respectively.

8. A VLSI module comprising:
a circuit means for generating at least one desired function;
a reference voltage generating means coupled to the circuit means, said reference voltage generating means having a phase lock loop therein, a frequency adjustment means for adjusting loop frequency until a desired reference voltage is provided at a selected node of the phase lock loop and a circuit arrangement, operatively coupled to the frequency adjustment means, for locking the loop frequency to a value at which a desired voltage is attained; and
an interface means for coupling the circuit means to a bus.

9. The reference voltage generator of claim 5 wherein the frequency adjustment means includes an oscillator for generating clock signals;

a divide by M circuitry, M being an integer, for interconnecting the clock signals to an input of phase detector in said phase lock loop; and a logic control circuit for supplying signals to the divide by M circuitry.

10. The reference voltage generator of claim 9 wherein the logic control circuit includes a ripple counter with a plurality of output ports connected to the divide by M circuitry; and an input port for receiving input clock pulses for toggling selected ones of the plurality of output ports.

11. The reference voltage generator of claim 10 wherein the circuit arrangement includes a plurality of resistors connected in parallel with each resistor having a first end to be connected to a first voltage source and a second end connected to one end of a laser fuse and another end of said laser fuse to be connected to a second voltage source wherein each one of said serially connected resistor and fuse is connected to selected ones of the plurality of output ports and selected ones of said laser fuse are opened when a count in the ripple counter is at the value where the desired reference voltage is attained.

12. A method for generating a fixed reference voltage comprising the steps of:

(a) providing a phase lock loop with a feed forward path including a phase detector with an output connected to an input of a charge pump, an output of the charge pump connected to an input of a loop filter and an output of the loop filter providing the fixed reference voltage and connected to a feed back path;

(b) providing a divide by M circuit arrangement having a first input for receiving clock signals, an output connected to the phase detector and data inputs for receiving data;

(c) providing a first circuit arrangement for generating the data;

(d) providing a second circuit arrangement for locking the data to a fixed value;

(e) operatively connecting the first circuit arrangement and second circuit arrangement to the data inputs;

(f) applying the clock signals to the first input;

(g) applying clock signals to the first circuit arrangement until the fixed reference voltage is generated; and (h) using a count resulting from the data generated in step (c) to activate the second circuit arrangement to permanently lock the phase lock loop to a frequency of which the fixed reference voltage is attained.

* * * * *